United States Patent
Markmann et al.

(10) Patent No.: US 12,556,155 B2
(45) Date of Patent: Feb. 17, 2026

(54) ELECTRICALLY TUNABLE SURFACE ACOUSTIC WAVE RESONATOR

(71) Applicant: International Business Machines Corporation, Armonk, NY (US)

(72) Inventors: Sergej Markmann, Bochum (DE); Gian R. von Salis, Aeugst am Albis (CH)

(73) Assignee: International Business Machines Corporation, Armonk, NY (US)

( * ) Notice: Subject to any disclaimer, the term of this patent is extended or adjusted under 35 U.S.C. 154(b) by 541 days.

(21) Appl. No.: 18/118,378

(22) Filed: Mar. 7, 2023

(65) Prior Publication Data

US 2024/0372522 A1  Nov. 7, 2024

Related U.S. Application Data

(62) Division of application No. 16/008,634, filed on Jun. 14, 2018, now Pat. No. 11,652,463.

(51) Int. Cl.
  *H03H 9/02* (2006.01)
  *H03H 3/08* (2006.01)
  (Continued)

(52) U.S. Cl.
  CPC ............... *H03H 9/02* (2013.01); *H03H 3/08* (2013.01); *H03H 9/02685* (2013.01);
  (Continued)

(58) Field of Classification Search
  CPC .. H03H 9/02; H03H 9/02685; H03H 9/02897; H03H 9/14552; H03H 9/02535; H03H 9/25; H10N 30/06; H10N 30/08
  See application file for complete search history.

(56) References Cited

U.S. PATENT DOCUMENTS

| 4,028,648 A | 6/1977 | Hartmann et al. |
| 4,249,146 A | 2/1981 | Yen et al. |

(Continued)

FOREIGN PATENT DOCUMENTS

| CN | 101977029 A | 2/2011 |
| CN | 105427570 A | 3/2016 |

(Continued)

OTHER PUBLICATIONS

Datta, S., et al., "An analytical theory for the scattering of surface acoustic waves by a single electrode in a periodic array on a piezoelectric substrate", Journal of Applied Physics, Received Jun. 20, 1979; accepted for publication Jun. 2, 1980, Sep. 1980, pp. 4817-4823, vol. 51, No. 9.

(Continued)

*Primary Examiner* — Derek J Rosenau
(74) *Attorney, Agent, or Firm* — Scully, Scott, Murphy & Presser, P.C.; Erik K. Johnson

(57) ABSTRACT

A surface acoustic wave resonator device comprises a substrate supporting: a gateable, electrically conducting layer; an interdigital transducer (IDT); a reflector grating that comprises a plurality of electrically separated fingers; a main ohmic contact; and a gate element. The IDT is configured to be connectable to a ground. The conducting layer is configured to be connectable to the ground via the main ohmic contact, while each of said fingers is electrically connected to a lateral side of the conducting layer. This defines a gateable channel, which extends from the fingers to the ground via the conducting layer and the main ohmic contact. The gate element is electrically insulated from the conducting layer. The gate element is configured to allow an electrical impedance of the gateable channel to be continuously tuned by applying a voltage bias to this gate element with respect to the ground, in operation of the device.

7 Claims, 8 Drawing Sheets

(51) Int. Cl.
*H03H 9/145* (2006.01)
*H03H 9/25* (2006.01)
*H10N 30/06* (2023.01)

(52) U.S. Cl.
CPC .... *H03H 9/02897* (2013.01); *H03H 9/14552* (2013.01); *H03H 9/25* (2013.01); *H10N 30/06* (2023.02); *H03H 2009/02165* (2013.01)

(56) References Cited

U.S. PATENT DOCUMENTS

| | | | |
|---|---|---|---|
| 4,354,166 | A | 10/1982 | Grudkowski |
| 5,010,269 | A | 4/1991 | Hikita et al. |
| 5,200,664 | A * | 4/1993 | Sugai ............... H03H 9/02976 310/313 R |
| 5,221,870 | A | 6/1993 | Nakahata et al. |
| 5,262,977 | A | 11/1993 | Mitsutsuka |
| 5,440,189 | A | 8/1995 | Nakahata et al. |
| 6,049,155 | A | 4/2000 | Graebner et al. |
| 6,194,808 | B1 | 2/2001 | Yamanouchi et al. |
| 7,683,742 | B2 | 3/2010 | Cathelin et al. |
| 7,939,987 | B1 | 5/2011 | Solal et al. |
| 8,665,038 | B2 | 3/2014 | Belot et al. |
| 2002/0036549 | A1 | 3/2002 | Matsuda et al. |
| 2016/0191017 | A1 | 6/2016 | Edrees et al. |
| 2017/0214382 | A1 | 7/2017 | Bhattacharjee |
| 2017/0214383 | A1 | 7/2017 | Bhattacharjee |

FOREIGN PATENT DOCUMENTS

| | | |
|---|---|---|
| CN | 107819448 B | 10/2020 |
| JP | S52105752 A | 9/1977 |
| JP | S6077510 A | 5/1985 |
| JP | S61187539 A | 8/1986 |
| JP | 63-092421 U | 6/1988 |
| JP | 6392421 B2 | 9/2018 |

OTHER PUBLICATIONS

Gustafsson, M.V., et al., "Propagating phonons coupled to an artificial atom", Science, Oct. 10, 2014, pp. 207-211, vol. 346, Issue 6206.

Hay, R.R., "Digitally-Tunable Surface Acoustic Wave Resonator", Dissertation submitted in partial fulfillment of the requirements for the degree of Doctor of Philosophy in Electrical and Computer Engineering, Boise State University, Jun. 2009, 135 pages.

Hunt, W.D., et al., "Reduction of surface acoustic wave grating impedance and velocity perturbations via buried pimetallic electrode geometries", Journal of Applied Physics, Received Nov. 2, 1987; accepted for publication Jan. 26, 1988. Jun. 1, 1988, pp. 5237-5245, vol. 63, No. 11.

International Search Report dated Oct. 7, 2019, issued in PCT/EP2019/064698, 12 pages.

List of IBM Patents or Patent Applications Treated as Related, Mar. 7, 2023, 2 pages.

Manenti, R., et al., "Surface acoustic wave resonators in the quantum regime", Physical Review B 93, Jan. 2016, pp. 041411-1-041411-4.

Notice of Reasons for Refusal dated Dec. 15, 2022 received in Japanese Patent Application No. 2020-560306, 3 pages.

Response to the Examiner's Observations dated Jul. 12, 2022 received in Application No. EP 19731164.0, 10 pages.

Schuetz, M.J.A., et al., "Universal Quantum Transducers Based on Surface Acoustic Waves", Physical Review X 5, Received Apr. 22 2015; published Sep. 10, 2015, pp. 031031-1-031031-30.

* cited by examiner

Cut I

Cut II

Cut III

ELECTRICALLY TUNABLE SURFACE ACOUSTIC WAVE RESONATOR

BACKGROUND

The present disclosure relates in general to the field of surface acoustic wave resonators, also called SAW resonators, as well as related devices, methods of operation and fabrication thereof. In particular, it is directed to an electrically tunable SAW resonator, which defines a gateable channel and incorporates a monolithically integrated structure acting as a field effect transistor gate. The conductivity of the channel is a function of the potential applied across the gate and the gateable channel.

Recent advances in circuit quantum electrodynamics have driven an unprecedented development of quantum computers, especially in the field of superconducting qubits. Recent proposals of universal quantum transducers based on surface acoustic waves (SAWs) enables quantum computation using quantum phonon dynamics. This very recent concept, which relies on mechanical properties (acoustic phonons) of piezoelectric materials for quantum information, provides a universal platform for realizing quantum hybrid systems. Such mechanical systems, which include SAW resonators, were recently investigated in the quantum regime operating at several GHz and in the milli-Kelvin range. Coupling of acoustic phonons to artificial atoms has been successfully demonstrated. SAW resonators operating in the quantum regime are not only potential candidates to coherently link superconducting qubits amongst each other, but also to systems such as quantum dots, spin-qubits, trapped-ions and photonic cavities. One of the advantages of using phonons instead of photons for coupling qubits is the dramatically smaller footprint required by the device, due to the wavelength of phonons, which is five orders of magnitude smaller compared to photons at the same frequency.

One of the points that need be addressed is the frequency of the SAW resonators. Technologically speaking, it is quite demanding to fabricate SAW resonators having frequencies that exactly match a prescribed frequency, since manufacturing tolerances lead to undesirable frequency shifts. In addition, for the integration of a SAW resonator in an apparatus such as a quantum system, a frequency-tunable SAW resonator is desirable, to facilitate a strong coupling.

One way of tuning the frequency of a SAW resonator is to use an integrated heater. Due to the thermal expansion/compression of the material, a frequency shift is observed, which is caused by the induced mechanical stress. However, such an approach is sometimes not applicable. This is notably the case for quantum computation, since the operating temperature of the device must be in the quantum limit: $k_B T < hf$, where $k_B$ is the Boltzmann's constant, T is the temperature, f is the frequency, and h the Planck's constant.

So far, the electrical tuning of SAW resonators is achieved by tuning the carrier density below the interdigital transducer (IDT) and/or below the mirror grating [1]. Changing the carrier concentration influence the losses and hence the internal quality factor. This approach has the disadvantage of reducing the quality factor of SAW resonators, which, at GHz frequencies, is not much larger than the threshold needed for strong coupling in prior devices. Higher-order harmonics can be used as well [2]. However, this is not always applicable, e.g., for coupling with qubits (superconducting qubits, spin qubits, etc.) as higher-order harmonics appear at discrete multiple frequencies of the fundamental mode and are thus not continuously tunable.

SUMMARY

According to an aspect, the present invention in an embodiment is embodied as a surface acoustic wave resonator device, or SAW resonator device. This device comprises a substrate supporting: a gateable, electrically conducting layer; an interdigital transducer (IDT); a reflector grating that comprises a plurality of electrically separated fingers; a main ohmic contact; and a gate element. The IDT is configured so as to be connectable to a ground. The conducting layer is configured so as to be connectable to said ground via the main ohmic contact, while each of said fingers is electrically connected to a lateral side of the conducting layer. This defines a gateable channel, which extends from said fingers to the ground via the conducting layer and the main ohmic contact. In addition, the gate element is electrically insulated from the conducting layer. The gate element is furthermore configured to allow an electrical impedance of the gateable channel to be continuously tuned by applying a voltage bias to this gate element with respect to said ground, in operation of the device.

The gate can be regarded as a field effect transistor gate (FET gate), whereby the conductivity of the channel is a function of the potential applied across the gate and the gateable channel, e.g., between gate and the main ohmic contact. The reflector fingers can be seen as drain terminals, connected via a gateable channel to the main ohmic contact, whereas the main ohmic contact can be seen as a source terminal. The FET gate is configured to continuously tune an electrical impedance between the reflector fingers and a common ground. This, in turn, can be exploited to continuously tune, via a gate voltage applied to the FET gate, a reflection coefficient of the reflector grating. The amount of reflection from the reflector grating depends on whether individual fingers of the reflector gratings are electrically shortened or opened by the FET gate. The effective cavity length happens to be continuously tuned in the process. This eventually makes it possible to achieve a frequency tuning of the SAW resonator modes.

Possible fabrication methods as described herein make it possible to monolithically integrate the FET structure, i.e., the electrically conducting layer, the reflector grating and the gate element, in the SAW device. Thus, in embodiments, the electrically conducting layer, the reflector grating and the gate element are monolithically integrated in the device.

The device may further comprise side ohmic contacts, to ensure a satisfactory electrical contact between the fingers and the gate channel. The side ohmic contacts are supported on the substrate, and each of the fingers of the reflector grating is connected to a lateral side of the conducting layer via a respective one of the side ohmic contacts. By controlling the gate bias, all said fingers can be connected to the ground via the side and main ohmic contacts (which results in a shortened reflector grating) or can be electrically disconnected from the ground.

In some embodiments, the SAW resonator device further comprises a barrier, to lower or suppress leakage currents from the gate to the conducting layer. This barrier generally extends between the electrically conducting layer and the gate element, such that the electrically conducting layer extends between the substrate and the barrier, so as to electrically insulate the gate element from the conducting layer.

In some embodiments, the barrier comprises both a basis layer and an insulating layer, the latter patterned onto the basis layer, so as to extend between the basis layer and the gate element.

In embodiments, each of the side ohmic contacts and the main ohmic contact extends through the barrier, down to the electrically conducting layer. This way, a compact configuration can be achieved, wherein the ohmic contacts extend through the barrier, from the top down to the electrically conducting layer, thereby easing the multiple connections required, e.g., to the fingers and ground as well as to the IDT.

In some embodiments, the main ohmic contact and the side ohmic contacts comprise, each, a tip protruding above the barrier, whereby the barrier extends between protruding tips of the ohmic contacts and the electrically conducting layer.

In some embodiments, the barrier and the electrically conducting layer altogether form a mesa on the substrate, and each of the fingers of the reflector grating comprises an out-of-plane portion extending along a lateral side of the mesa, which out-of-plane portion leads to a contact portion contacting a respective one of the side ohmic contact.

In some embodiments, the IDT comprises two sets of interdigitated electrodes, wherein electrodes of one of said sets comprise, each, an out-of-plane portion extending along a lateral side of the mesa, which out-of-plane portion leads to a contact portion contacting the main ohmic contact.

In embodiments, said substrate comprises a piezoelectric material. In variants, however, the substrate comprises a non-piezoelectric material, supporting one or more piezoelectric material portions, which support the fingers and elements of the IDT.

In some embodiments, said plurality of electrically separated fingers are arranged in two sets of fingers, wherein the two sets of fingers extend on opposite sides of the IDT on the substrate.

In some embodiments, each of said fingers is electrically connected to a same lateral side of the conducting layer, via a respective one of the side ohmic contacts and the IDT is arranged vis-à-vis that same lateral side.

In some embodiments, each of the fingers of the two sets is bent in-plane with the substrate, so as for the fingers to exhibit, each, a first portion and a second portion, whereby first portions for the fingers are parallel to each other and second portions for the fingers are parallel to each other. The first portions of the fingers of one of the two sets connect to respective side ohmic contacts on a first lateral side of the conducting layer, whereas the first portions of the fingers of the other one of the two sets connect to respective side ohmic contacts on a second lateral side of the conducting layer that is opposite to said first lateral side. The IDT is arranged vis-à-vis a third lateral side of the conducting layer, which third lateral side extends between and contiguous to said first lateral side and said second lateral side, whereby the IDT extends between second portions of the fingers of one of the two sets and second portions of the fingers of the other one of the two sets.

In some embodiments, the gate element extends parallel to a given lateral side of the conducting layer to which fingers of the reflector grating connect.

In some embodiments, said given lateral side of the conducting layer has a comb profile, exhibiting teeth, whereby fingers of the reflector grating connect to a respective one of the teeth via a respective one of the side ohmic contacts.

In some embodiments, said gate element is a first gate element and the device further comprises a second gate element, which is electrically insulated from the conducting layer and the first gate element, whereby two gateable channels are defined for the two sets of fingers, respectively. Each of the channels extends from fingers of a respective one of the two sets to the ground. The first gate element and the second gate element are, each, configured to independently allow an electrical impedance of a respective one of the two gateable channels to be continuously tuned by applying a voltage bias to the corresponding gate element with respect to said ground, in operation of the device.

In some embodiments, the IDT is sufficiently reflecting to act both as an acoustic source and an acoustic reflector, so as to (fully) decouple behaviors of the two sets of reflector fingers, in operation of the device.

According to another aspect, the invention is embodied as a method of operating a SAW resonator device, such as described above. I.e., each of the electrically conducting layer and the IDT is connectable to a ground and the conducting layer is connectable to said ground via the main ohmic contact, while each of the fingers is electrically connected to a lateral side of the conducting layer, so as to define a gateable channel, as evoked earlier. The method comprises a step of tuning an electrical impedance of the gateable channel by applying a voltage bias to the gate element with respect to the ground. The electrical impedance of the gateable channel may for instance be tuned so as to tune a reflection coefficient of the reflector grating. In addition, this reflection coefficient may possibly be tuned so as to tune a frequency of the SAW resonator.

In embodiments, the method further comprises, prior to tuning said electrical impedance: fabricating the device; and checking an initial value of said electrical impedance, whereby said impedance is tuned so as for it to reach a desired value that departs from said initial value.

In some embodiments, the method further comprises, prior to checking said actual value, integrating the fabricated SAW device in an apparatus. For example, said apparatus may be a quantum computation device, where the SAW device links two computational circuits of the quantum computation device.

According to another aspect, the invention can be embodied as a method of fabrication of a SAW resonator device such as described above. Basically, this method requires to provide a substrate and processed a FET-like structure on the substrate. This FET-like structure comprises a gateable, electrically conducting layer, a main ohmic contact and side ohmic contacts, so as for the electrically conducting layer to be connectable to a ground via the main ohmic contact. Next, a gate element is patterned on the fabricated structure, so as for the gate element to be electrically insulated from the conducting layer. Finally, a reflector grating is patterned, at least partly on the substrate provided. The grating comprises a plurality of electrically separated fingers, so as for each of the fingers to connect to a lateral side of the conducting layer via a respective one of the side ohmic contacts. This makes it possible to define a gateable channel that extends from said fingers to the ground via the side ohmic contacts, the conducting layer and the main ohmic contact. The gate element must be patterned so as to allow an electrical impedance of the gateable channel to be continuously tuned by applying a voltage bias to the gate element with respect to said ground, in operation of the device.

SAW devices, methods of operating such devices and related fabrication methods that embody the present invention will now be described, by way of non-limiting examples, and in reference to the accompanying drawings.

BRIEF DESCRIPTION OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which.

Figure 2:
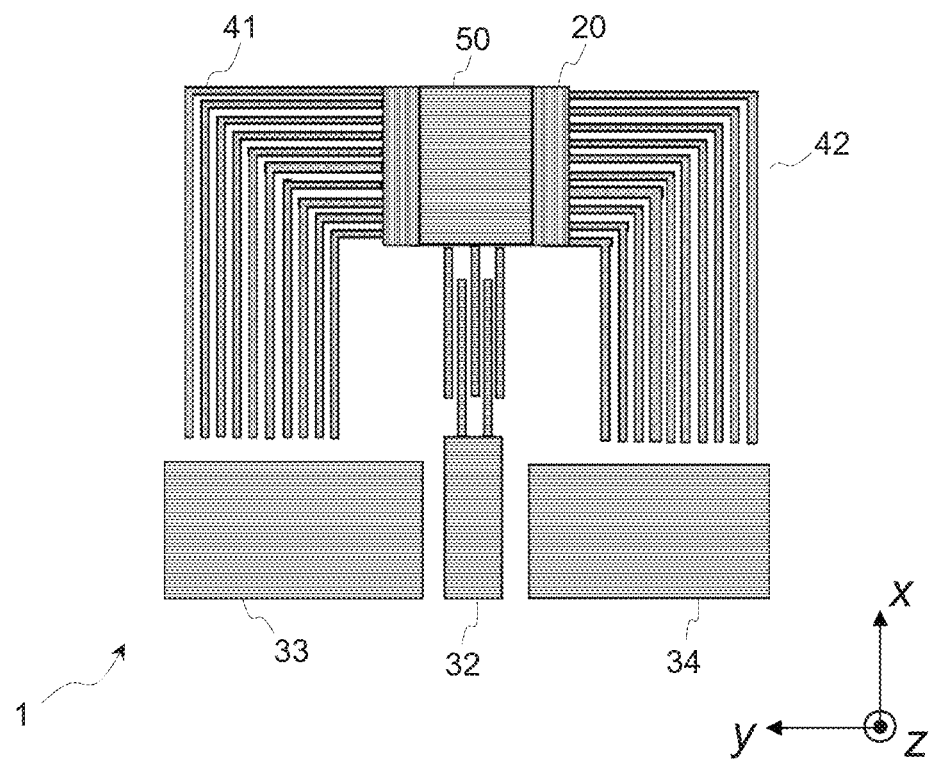
Figure 3:
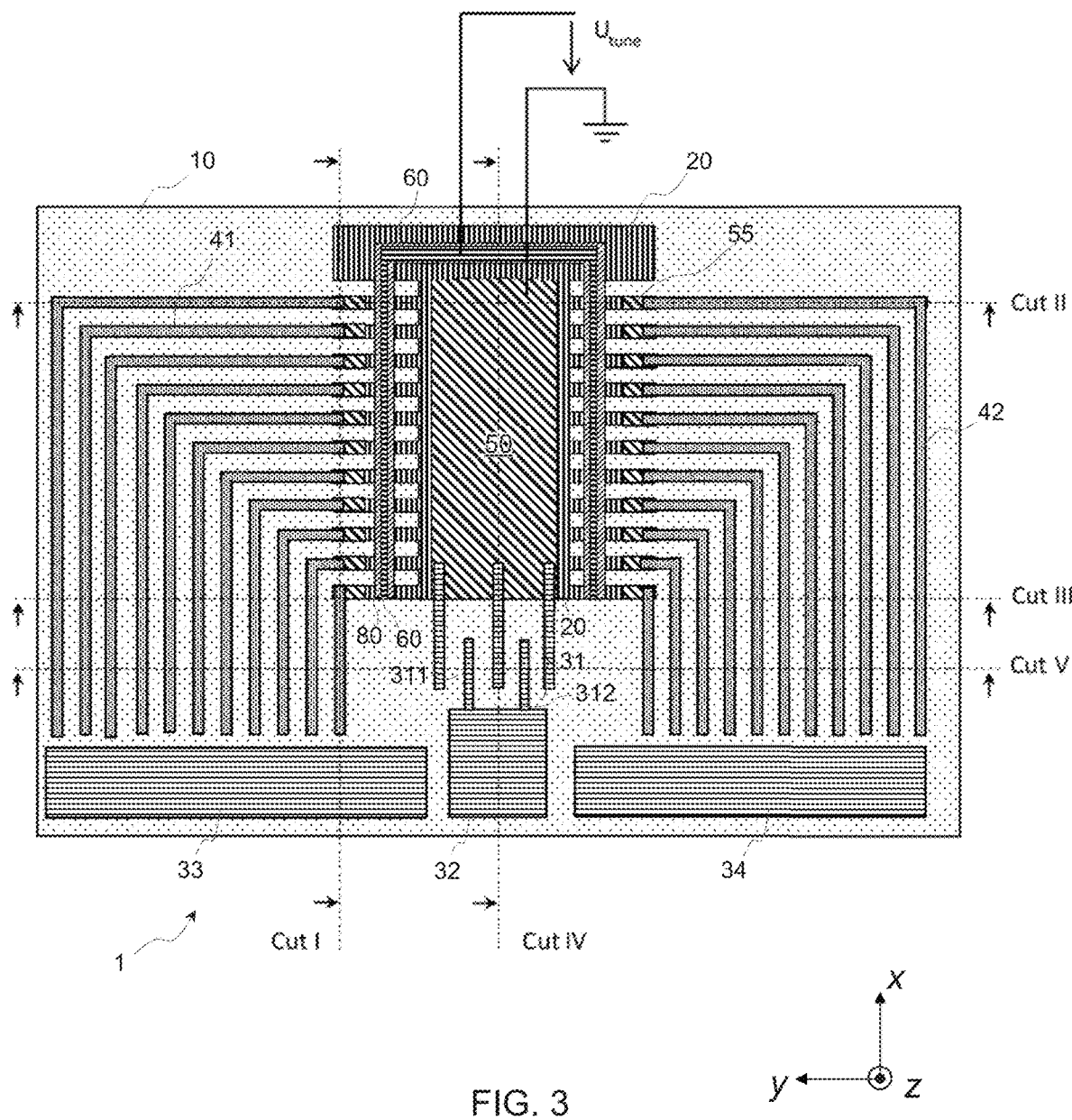
Figure 4A:
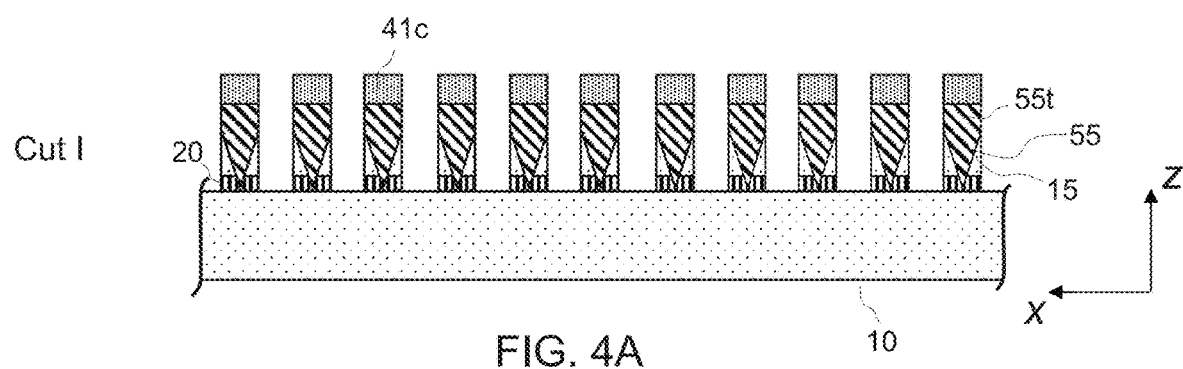
Figure 4B:
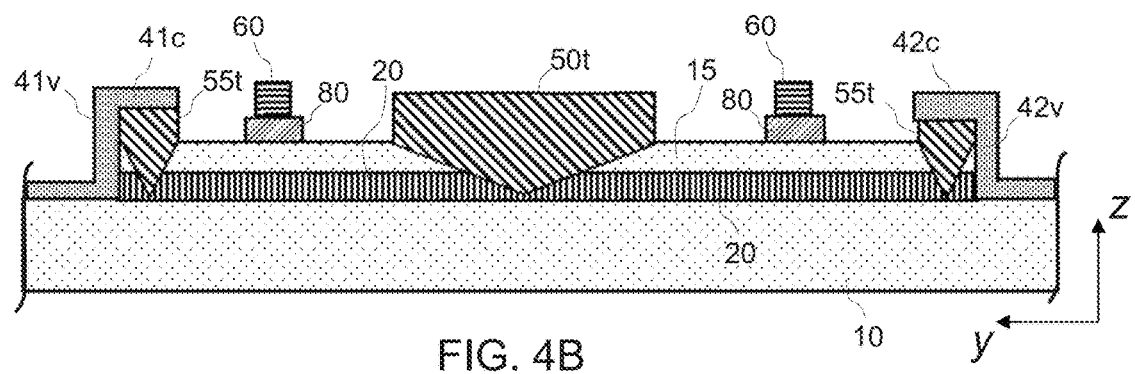
Figure 4C:
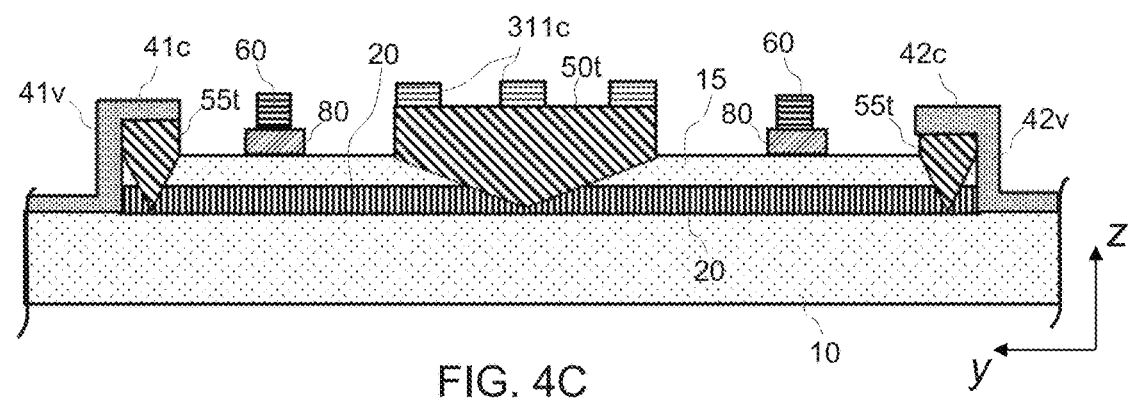
Figure 4D:
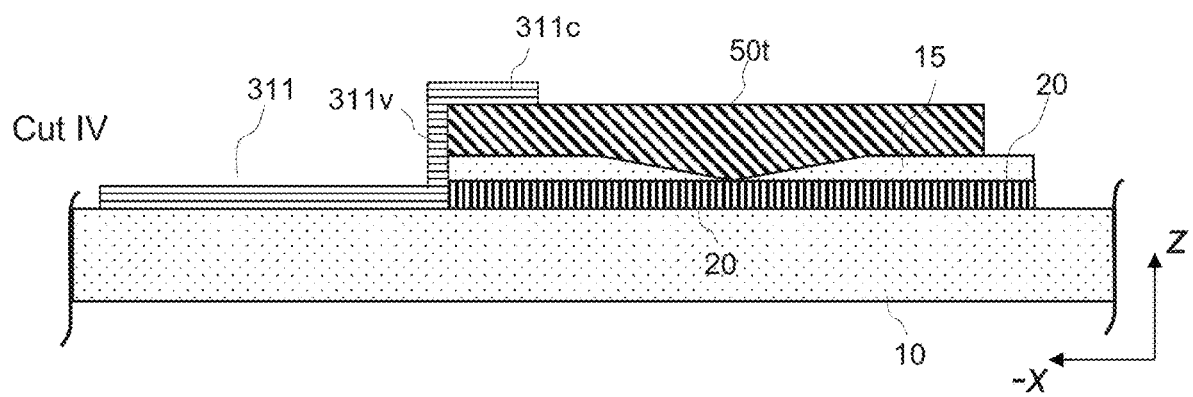
Figure 4E:
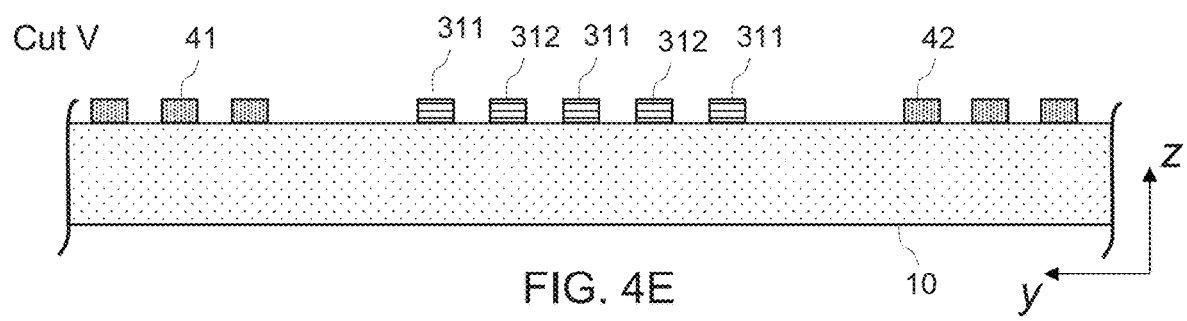
Figure 4F:
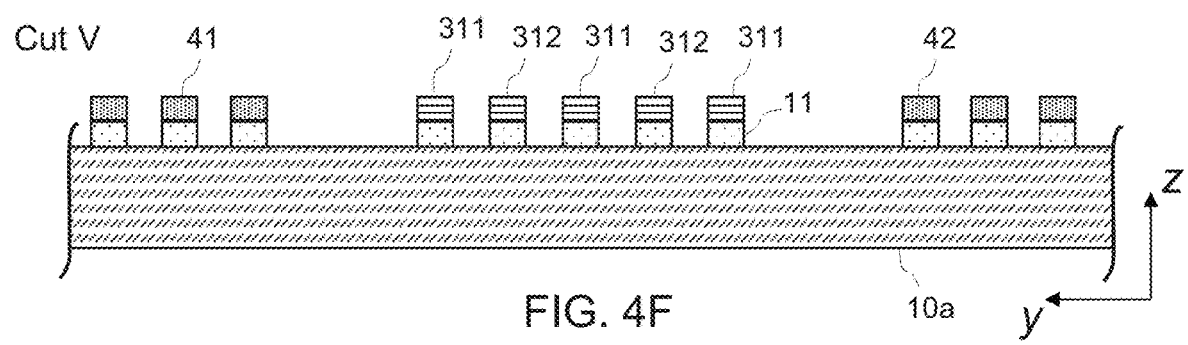
Figure 5:
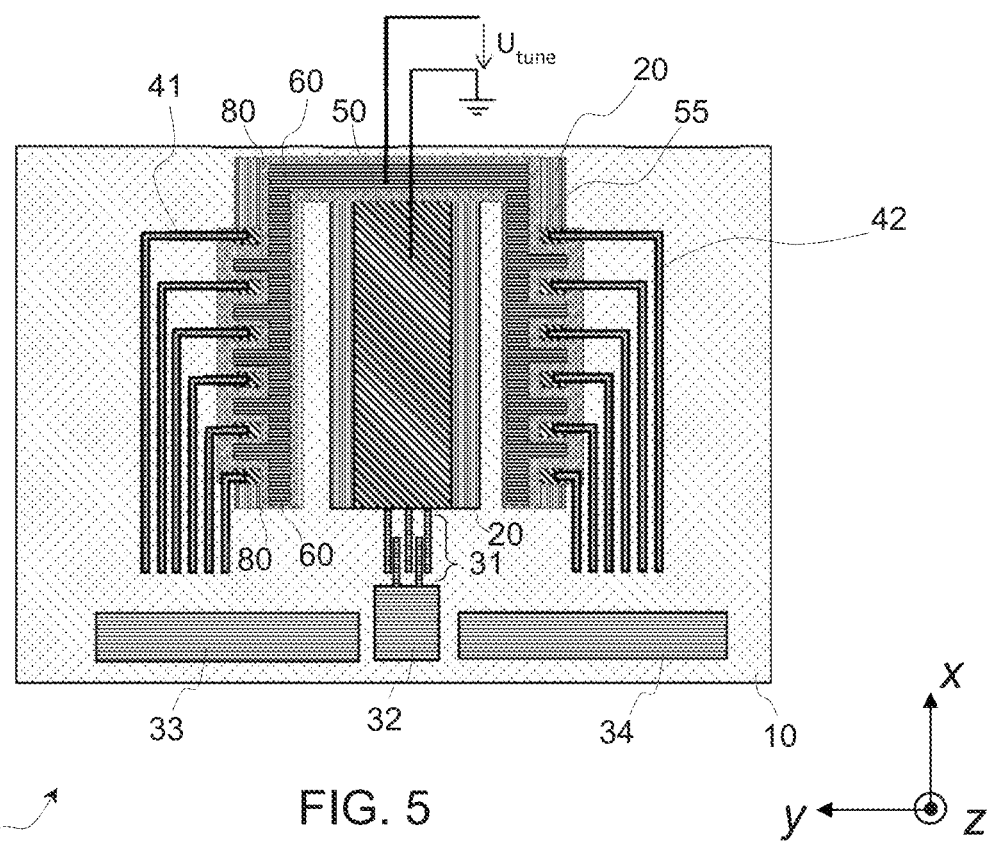
Figure 6:
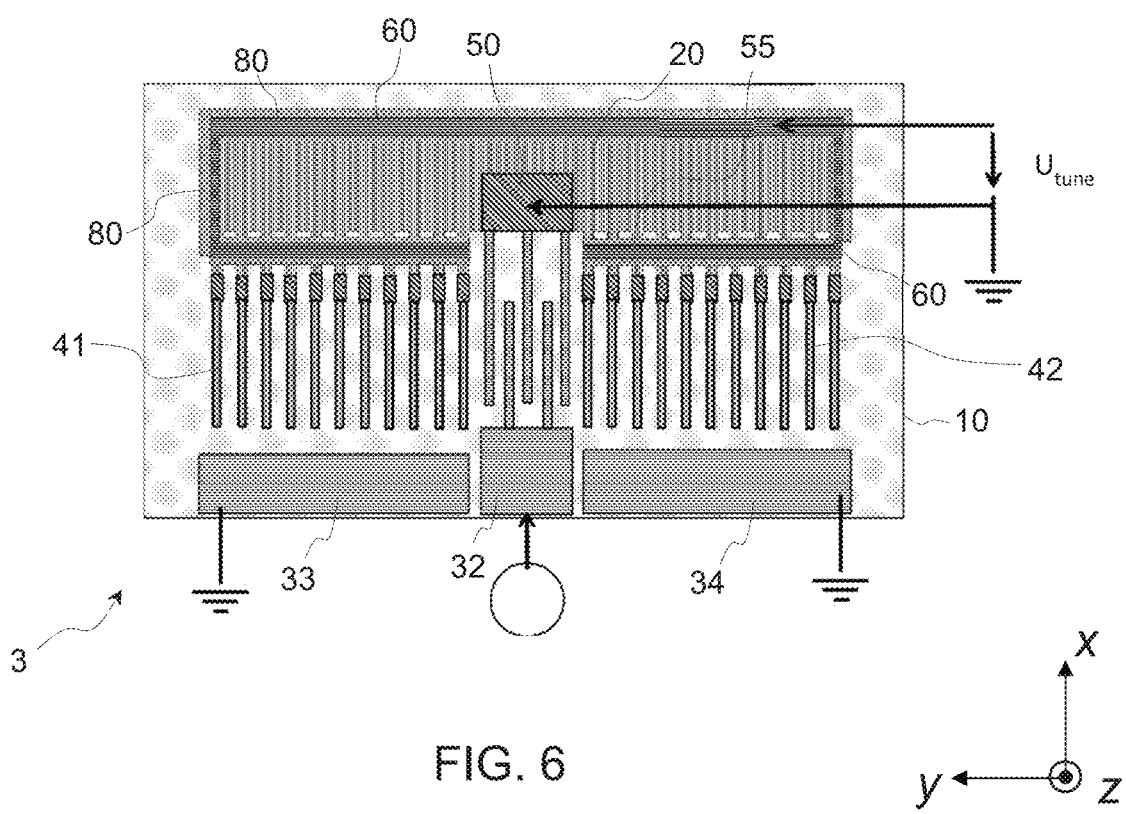
Figure 9:
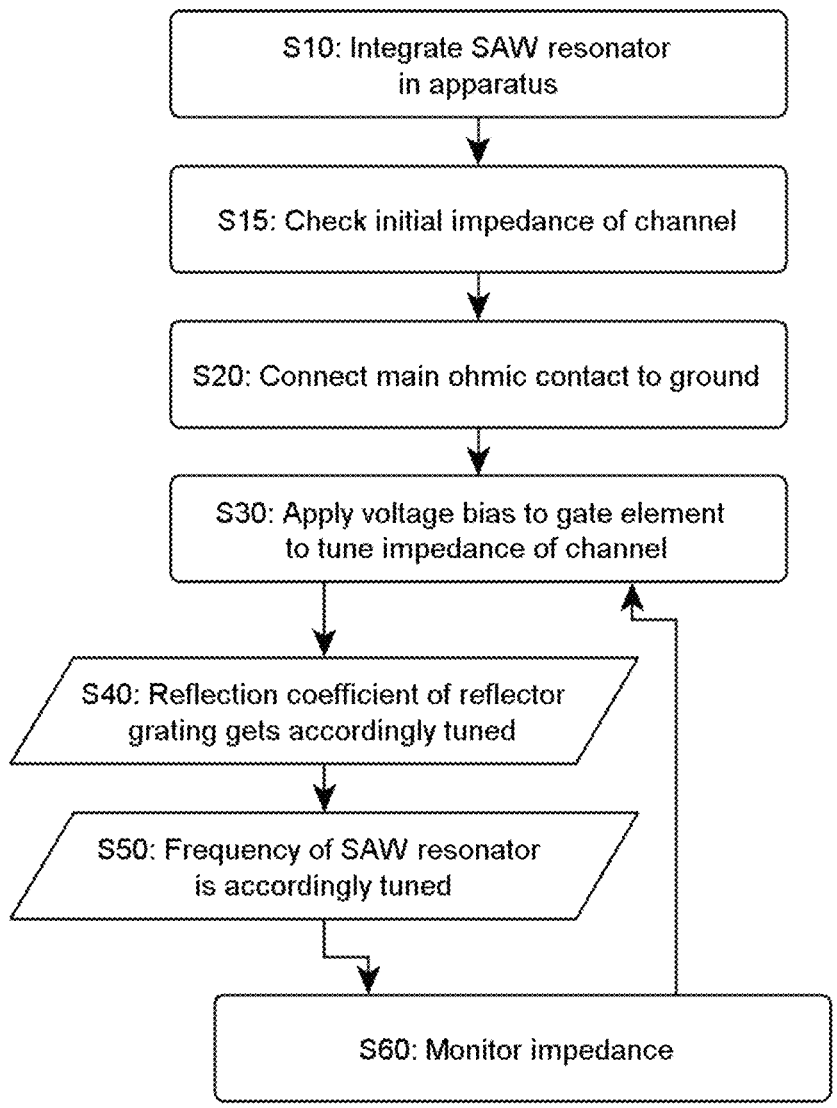
Figure 10:
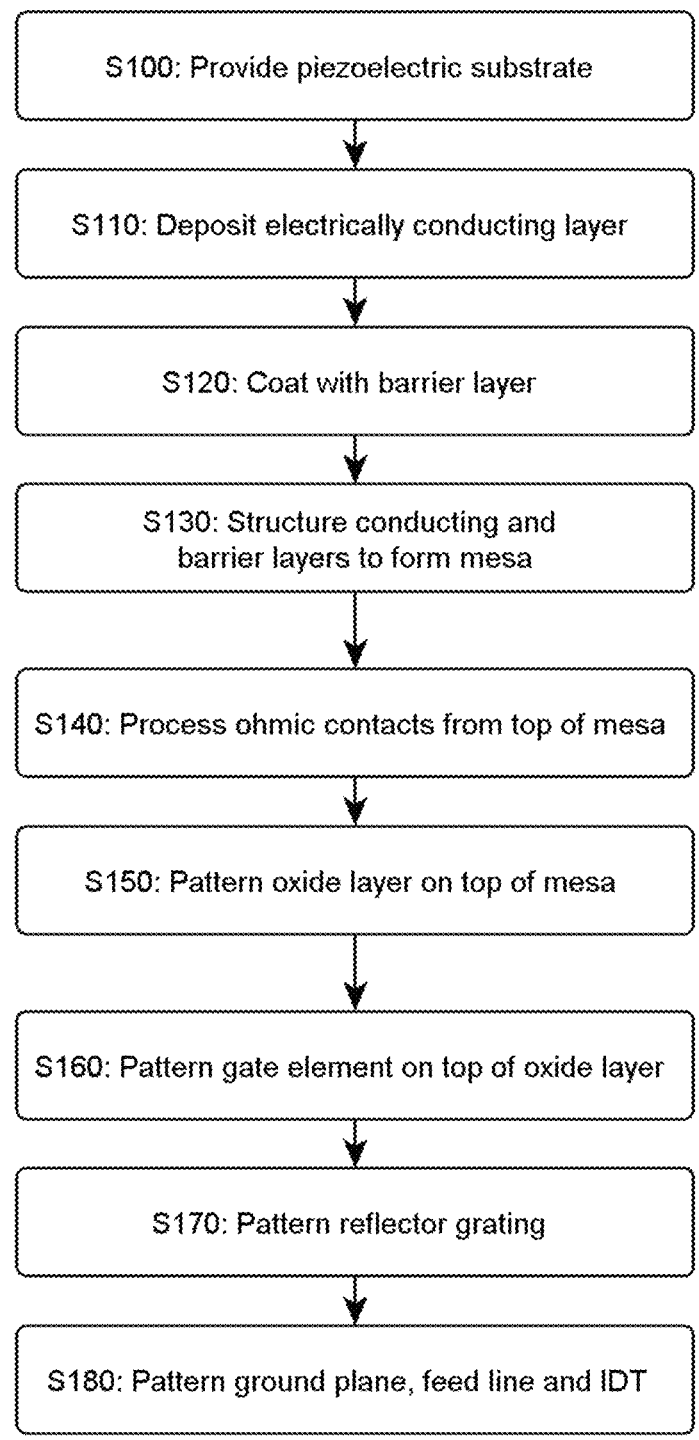

For comparison purpose, FIG. 2 similarly depicts a top view of a SAW resonator, which monolithically integrates a structure behaving as a field effect transistor (FET) gate, as involved in embodiments;

FIG. 3 is a top view of a device similar to that of FIG. 2, showing additional structural details, as in embodiments;

FIGS. 4A-4F depict 2D cross-sectional views of the device of FIG. 3. The planes upon which the sectional views are taken are indicated by broken lines in FIG. 3. FIG. 4F depicts a variant to FIG. 4E, wherein the substrate used for the SAW device is essentially made of a non-piezoelectric material;

FIGS. 5-8 are top views of variants to the device of FIG. 3. The designs proposed in FIGS. 7 and 8 define two gateable channels with corresponding gate elements. The depicted devices independently allow an electrical impedance of a respective one of the two channels to be continuously tuned by applying a voltage bias to a corresponding gate element, as in embodiments;

FIG. 9 is a flowchart illustrating high-level steps of a method of operating a device such as depicted in FIG. 3, 5 or 6, as in embodiments; and FIG. 10 is a flowchart capturing high-level fabrication steps of such a device, according to embodiments.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION

As mentioned earlier, it is very difficult to fabricate SAW resonators having prescribed frequencies, due to manufacturing tolerances. Being able to electrically tune frequencies of SAW resonators would nicely solve this problem. More generally, a frequency-tunable SAW resonator is desired, whose frequency can electrically be tuned. Starting from this observation, the present Inventors have devised solutions, which are now discussed in detail.

In reference to FIGS. 2-8, an aspect of the invention is first described, which concerns a frequency-tunable, surface acoustic wave resonator device 1-5, hereafter called a SAW resonator.

The SAW resonator 1-5 comprises a substrate 10 supporting a plurality of elements, which include: a gateable, electrically conducting layer 20; an interdigital transducer 31-32 (or IDT for short); a reflector grating 41-42 that comprises a plurality of electrically separated fingers 41, 42; a main ohmic contact 50; and a gate element 60.

As seen in FIGS. 3, 5-8, the conducting layer 20, the IDT 31-32, and the reflector grating 41-42 are laterally arranged on the substrate 10, i.e., in direct contact with or above the substrate 10. At least portions of the reflector fingers 41, 42 and the IDT 31-32 extend within an acoustic track defined on the substrate, laterally to the electrically conducting layer 20, to make up a SAW resonator.

The IDT 31-32 is configured so as to be connectable to a ground plane. Just like IDTs as generally used in SAW resonators, this IDT 31-32 is configured to convert electric signals into surface acoustic waves (SAWs) and, conversely, to convert SAWs into electric signals, whereas the fingers 41, 42 act as in-plane, lateral reflectors. In embodiments, the IDT 31-32 may be connected to the ground via the main ohmic contact, e.g., via a portion of the layer 20 (at the level of the ohmic contact) or via another conducting layer. Yet, only some of the elements of the IDT (i.e., only a subset 311 of the IDT fingers) are meant to be connected to the ground potential, as known per se. E.g., as seen in FIG. 3, every alternating finger 311 may be connected to ground, through the main ohmic contact 50. In such an implementation, the main ohmic contact 50 happens to be close enough, such that the fingers 311 are connected to the main contact 50. Still, any other suitable contact point (where there is a ground potential) could be similarly used to that aim.

The terminology "gateable, electrically conducting layer", as used herein for layer 20, refers to a structured layer of material, which comprises one or more portions of materials, whose electrical conductance can be varied through a gate. The conducting layer 20 is configured so as to be connectable to the ground. I.e., layer 20 can be connected to the ground via the main ohmic contact 50. Meanwhile, each of said fingers 41, 42 is electrically connected to a lateral side of the conducting layer 20. Such a configuration allows a gateable channel to be defined, which channel extends from the fingers 41, 42 to the ground via the conducting layer 20 and the main ohmic contact.

The gate element 60 is electrically insulated from the conducting layer 20. Furthermore, the element 60 is configured to allow an electrical impedance of the gateable channel to be continuously tuned by applying a voltage bias to this gate element 60 with respect to the ground, in operation of the device 1-5.

In terms of materials, the conducting layer 20 may for instance comprise one or more of the following materials: Lithium niobate ($LiNbO_3$), gallium arsenide (GaAs), gallium nitride (GaN), zinc oxide (ZnO), lithium tantalate ($LiTaO_3$), doped silicon (Si) or, still, another doped semiconductor material. Possible materials for the reflector gratings and IDT include: aluminum (Al), gold (Au), silver (Ag), copper (Cu), and molybdenum (Mo), amongst other examples. Aluminum may be used, as the latter has low acoustic losses at room temperature and no losses below 1K (superconductor). The ohmic contacts may for instance comprise Au, a gold/germanium alloy (Au/Ge), Si, or nickel (Ni), or, still, a stack of alternating layers of Si and Ni, for example. More generally, other eutectic systems (alloys) can be contemplated to ensure satisfactory ohmic contacts. For example, a Ni/Ge/Au alloy is a suitable choice for a GaAs layer 20, while Ti/Al/Ni/Au may be used for a GaN layer 20 and $InSnO_2$ for a ZnO layer 20, for example. The skilled person may similarly devise other, potentially suited combinations. For completeness, the substrate 10 may possibly comprise a piezoelectric material. In variants, however, the substrate may not be piezoelectric, as discussed later in detail.

Possible fabrication methods as described herein make it possible to monolithically integrate the FET structure, i.e., the electrically conducting layer 20, the reflector grating 41-42 and the gate element 60, in the device 1-5. Thus, the gate may be embodied as an integral element, which can be regarded as a field effect transistor gate (FET gate). The conductivity of the channel is a function of the potential applied across the gate and the gateable channel, e.g., between the gate and the main ohmic contact. The reflector fingers 41, 42 can be seen as drain terminals, which are connected via a gateable channel to the main ohmic contact, whereas the main ohmic contact can be seen as a source terminal.

Figure 1:
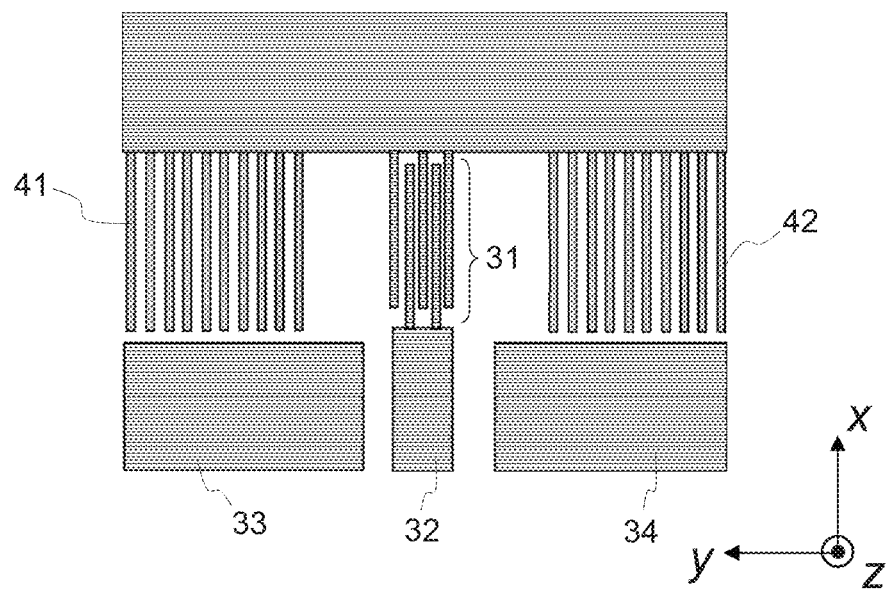
FIG. 1 is a top view of a surface acoustic wave (SAW) resonator according to the prior art, as perceived by the Inventors. Several details are omitted, for clarity.

The FET gate is configured to continuously tune an electrical impedance between the reflector fingers 41, 42 and a common ground. This, in turn, can be exploited to continuously tune, via a gate voltage applied to the FET gate, a reflection coefficient of the reflector grating. The amount of reflection from the reflector grating depends on whether individual fingers 41, 42 of the reflector gratings are electrically shortened or opened by the FET gate. The effective cavity length happens to be continuously tuned in the process. This eventually makes it possible to achieve a frequency tuning of the SAW resonator modes. In contrast, prior art devices such as depicted in FIG. 1 are not tunable in frequency; such SAW resonators do not integrate any FET gate.

Note, the present invention in some embodiments extends to SAW filters, which may for instance be realized out of two connected resonators such as described herein. Thus, a resonator as disclosed herein can be regarded as a building block for a tunable SAW filter or, even, another SAW device.

Referring more particularly to FIGS. 3, and 4A-4C: the SAW resonator may comprise side ohmic contacts 55, which are supported on the substrate 10. This way, each of the fingers 41, 42 of the reflector grating may be satisfactorily connected to a lateral side of the conducting layer 20 via a respective side ohmic contact 55. The function of the side ohmic contacts 55 is to ensure a satisfactory electrical contact between the fingers 41, 42 and the gate channel. Note, vertical portions 41v, 42v of the fingers, as involved in embodiments (see FIG. 4), may already ensure a sufficiently good electrical contact between the fingers and the layer 20, in which case the side ohmic contacts 55 may be omitted. This, however, is typically not possible when the conducting layer 20 reduces to a mere 2D electron/hole gas. And more generally, side ohmic contacts may be desired to improve the electrical connection.

Note, a downwardly pointing triangle symbol is used to denote the electrical connection between the ohmic contacts 50, 55 and the conducting layer 20 in the accompanying drawings, for the sake of depiction. In principle, any physical structure that makes it possible to obtain an electrical connection to the layer 20 may be contemplated. In practice, however, a filamentary-like connection may be sought between ohmic contacts 50, 55 and the conducting layer 20. This can be achieved by annealing, which results in a metal diffusion in to the conducting layer 20.

As seen in FIGS. 4A-4D, the SAW resonator device 1-5 may advantageously comprise an electrical barrier 15, 80. This barrier generally extends between the electrically conducting layer 20 and the gate element 60, such that the electrically conducting layer 20 extends, in turn, between the substrate 10 and the barrier 15, 80, so as to electrically insulate the gate element 60 from the conducting layer 20.

This barrier may for instance be provided as a continuous layer 15, which directly coats the electrically conducting layer 20 and/or as patterned layer portions 80 underneath the gate element 60. That is, this barrier may in fact be a dual, structured layer 15, 80, comprising both a basis layer 15 and an insulating layer 80, with the insulating layer 80 patterned onto the basis layer 15. In this case, the insulating layer 80 extends between the layer 15 and the gate element 60, as assumed in the embodiments of FIGS. 3-4. In such embodiments, the average plane of the basis layer 15 extends between the average plane of the electrically conducting layer 20 and the average plane of the gate element 60. On the other hand, the average plane of the conducting layer 20 extends between the average plane of the substrate 10 and the average plane of the basis layer 15.

This barrier 15, 80 may notably comprise an insulator, such as an oxide, or possibly a semiconductor, provided the latter can act as an electrical barrier between the gate 60 and the conducting layer 20. The basis layer 15 may further include a piezoelectric material, as, e.g., in specific embodiments where the conducting layer 20 is a doped semiconductor layer covered by a semiconductor layer 15 that serves as a potential barrier for the charge carriers in layer 20. For example, layer 20 may comprises GaAs, while layer 15 may comprises AlGaAs.

The conducting layer 20 and the basis layer 15 may be altogether processed (e.g., etched) so as to form a mesa above the substrate 10. Such a configuration makes it possible to monolithically integrate the conducting layer 20, the grating 41-42 and the gate element 60. In addition, this allows the conducting layer 20 to be easily connected to the ground via the main ohmic contact 50, as the latter may be provided in and extend through the basis layer 15, as discussed later.

The basis layer 15 may for example comprise an oxide such as, e.g. $SiO_2$, $Al_2O_3$, $HfO_2$, etc., or an undoped semiconductor material. In the latter case, the conductive layer 20 is typically implemented as a doped semiconductor layer with a small band gap, e.g., using materials like GaAs and AlGaAs for layers 15 and 10, respectively. In this way, mobile charge carriers remain confined in layer 20.

The insulating layer 80 may be an oxide too. The gate element 60 may directly cover the layer 80 underneath. Note, in FIG. 3, layer portions 80 appears wider than the gate element 60, for the sake of depiction (a consistent depiction is used in FIG. 4). This, however, is not necessary and the gate element 60 and the underlying oxide may have substantially the same width.

Providing an insulating layer 80 is not always necessary. For example, assuming it is possible to realize a Schottky gate (Metal-Semiconductor interface) on the layer 15 and the conducting layer 20 underneath the gate can be completely depleted via the gate action/bias, then the insulating layer 80 is not necessary. Similarly, for applications to, e.g., two-dimensional gases, this layer 80 is not required.

Still, such an insulating layer 80 may in all cases be useful to lower leakage currents from the gate 60 to the conducting layer 20. Thus, in embodiments, the barrier 15, 80 comprises both a basis layer 15 and an insulating layer 80, with the latter patterned onto the basis layer 15, so as to extend between the basis layer 15 and the gate element 60, as depicted in FIGS. 4B, 4C.

Conversely, the layer 15 is not necessarily needed if the insulating layer 80 is present. Thus, in variants, only the insulating layer 80 is provided, with no basis layer 15 underneath.

As illustrated in FIGS. 4A-4C, each of the side ohmic contacts 55 and the main ohmic contact 50 may extend through the basis layer 15, down to the electrically conducting layer 20. Ohmic contacts (e.g., Ni/Au/Ge eutectic alloys) can easily be fabricated through the barrier 15, either by etching the layer and/or by annealing.

By controlling the gate bias $U_{tune}$, all fingers 41, 42 of the resonator can be connected to the ground via the side and main ohmic contacts 50 (which results in a shortened reflector grating 41-42), or can be electrically disconnected from the ground. Note, the fingers 41, 42 do otherwise not connect to elements 33, 34, see FIG. 3, whose function is to support the feed line signal.

In embodiments, the main ohmic contact 50 and the side ohmic contacts 55 comprise, each, a tip 50t, 55t protruding above the basis layer 15. That is, the basis layer 15 of the barrier extends between protruding tips 50t, 55t of the ohmic contacts and layer 20. This way, a compact configuration can be achieved, wherein the ohmic contacts 50, 55 extend through layer 15, from the top down to the electrically conducting layer 20, thereby easing the multiple connections required, e.g., to the fingers 41, 42 and ground as well as to the IDT 31-32.

In embodiments, the basis layer 15 of the barrier and the electrically conducting layer 20 altogether form a mesa on the substrate 10. In addition, each of the fingers 41, 42 of the reflector grating comprises an out-of-plane portion 41v, 42v that extends along a lateral side of the mesa. This out-of-plane portion 41v, 42v leads to a contact portion 41c, 42c of the fingers, which portion contacts a respective one of the side ohmic contact 55. In variants, the fingers may directly connect to a lateral side of the layer 20, as evoked earlier.

As seen in FIGS. 4D, 4E, the IDT 31-32 typically comprises two sets 311, 312 of interdigitated electrodes. Electrodes of the set 311 may comprise, each, an out-of-plane portion 311v that extends along a lateral side of the mesa. This out-of-plane portion 311v leads to a contact portion 311c that contacts the main ohmic contact 50. In variants, electrodes 311 may contact, each, a lateral side of the conducting layer 20, at the level of the main ohmic contact 50, just like the fingers 41, 42. I.e., the electrodes 311 may directly connect to a lateral side of the layer 20 or to the main ohmic contact 50 via the portions 311v and 311c.

As said earlier, the substrate 10 may possibly comprise a piezoelectric material 10. However, in variants such as depicted in FIG. 4F, the substrate comprises a non-piezoelectric material 10a (e.g., Si), supporting one or more piezoelectric material portions 11, which in turn support the fingers 41, 42 and elements of the IDT 31. The FET-like structure too may be deposited on the non-piezoelectric substrate 10a (not shown in FIG. 4F). Note, the piezoelectric layer 11 does not need to extend over the entire (e.g., Si) substrate 10a, even though it possibly may. It is sufficient to have piezoelectric layer portions 11 patterned below the reflector fingers 41, 42 and below the IDT fingers 31, 32.

Many structural variants can be contemplated for the SAW resonators. For instance, in SAW resonator devices 1-5 as depicted in FIGS. 3, 5-8, the fingers 41, 42 are arranged in two sets, wherein the two sets of fingers 41, 42 extend on opposite sides of the IDT 31-32 on the substrate 10. In the example of FIG. 6, each finger 41, 42 of the device 3 essentially comprises a single straight section (in-plane with the substrate 10), whereby two sets of straight fingers 41, 42 extend on opposite sides of the IDT. In the examples of FIGS. 3, 5, 7 and 8, each finger 41, 42 of the devices 1, 2, 4 and 5 essentially include two bent portions (in-plane), which notably define two sets of lower portions of the fingers 41, 42, extending along axis x. The lower portions form two sets arranged on opposite sides of the IDT.

In more details, in the embodiment of FIG. 6, each of said fingers 41, 42 is electrically connected to a same lateral side (extending along axis y) of the conducting layer 20, via a respective one of the side ohmic contacts 55 and the IDT 31-32 is arranged vis-à-vis that same lateral side. The reflector fingers 41, 42 need not be bent in that case.

On the contrary, in the embodiments of FIGS. 3, 5, 7 and 8: each finger 41, 42 is bent in-plane with the substrate 10. Thus, each finger 41, 42 exhibits a first portion (extending parallel to axis y) and a second portion (extending parallel to axis x), whereby first portions for the fingers 41, 42 are parallel to each other and second portions for the fingers are parallel to each other. First portions of the fingers 41 connect to respective ohmic contacts 55 on a first lateral side (parallel to axis x, on the LHS) of the conducting layer 20, whereas first portions of the fingers 42 connect to respective ohmic contacts 55 on a second lateral side of layer 20 (parallel to axis x, on the RHS), i.e., opposite to said first lateral side. In addition, the IDT 31-32 is arranged vis-à-vis a third (central) lateral side of the conducting layer 20. That is, this third side extends parallel to axis y, between and contiguous with each of the first and second lateral sides of layer 20. In such a structural arrangement, the IDT 31-32 extends between second portions of fingers 41 and second portions of the fingers 42.

In each of the embodiments shown in FIGS. 3, 5-8, the gate element 60 notably extends parallel to a given lateral side (i.e., parallel to axis x) of the conducting layer 20, to which fingers 41, 42 of the reflector grating otherwise connect. In the example of FIG. 6, the gate element 60 notably extends parallel to the single lateral side (i.e., extending along y) of layer 20 to which the fingers 41, 42 connect. In the examples of FIGS. 3, 5, 7 and 8, the gate element 60 is structured so as to comprise two portions, each extending parallel to opposite lateral sides (i.e., along axis x) of layer 20, to which opposite sides fingers 41, 42 connect.

Figure 7:
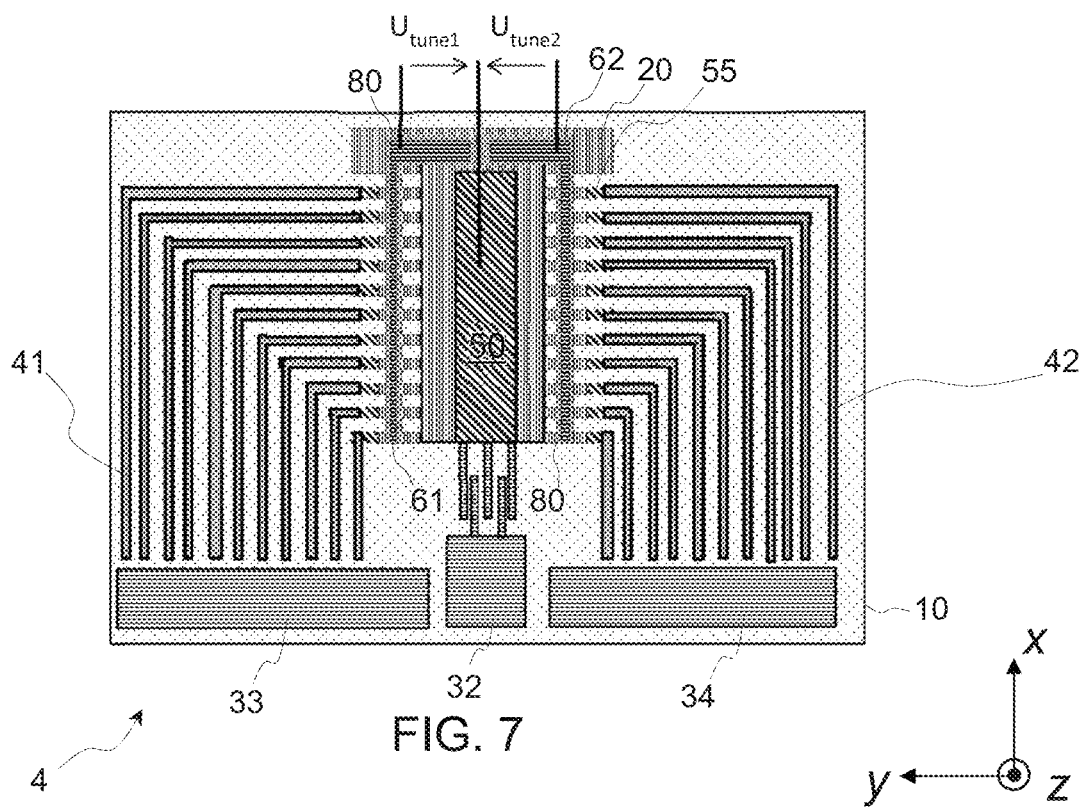

In the embodiments of FIGS. 3, 6 and 7, the SAW resonators 1, 3, 4 involve a conducting layer 20, whose lateral sides (i.e., extending along x) have a comb profile, exhibiting teeth. Here, fingers 41, 42 of the reflector grating connect to respective teeth via respective side ohmic contacts 55. That is, each finger 41, 42 connects to layer 20 via a respective side contact 55 and a respective tooth, to establish a sufficient electrical connection to the gateable channel. The connection is instead achieved by means of notches in layer 20 in the examples of FIGS. 5 and 8.

Figure 8:
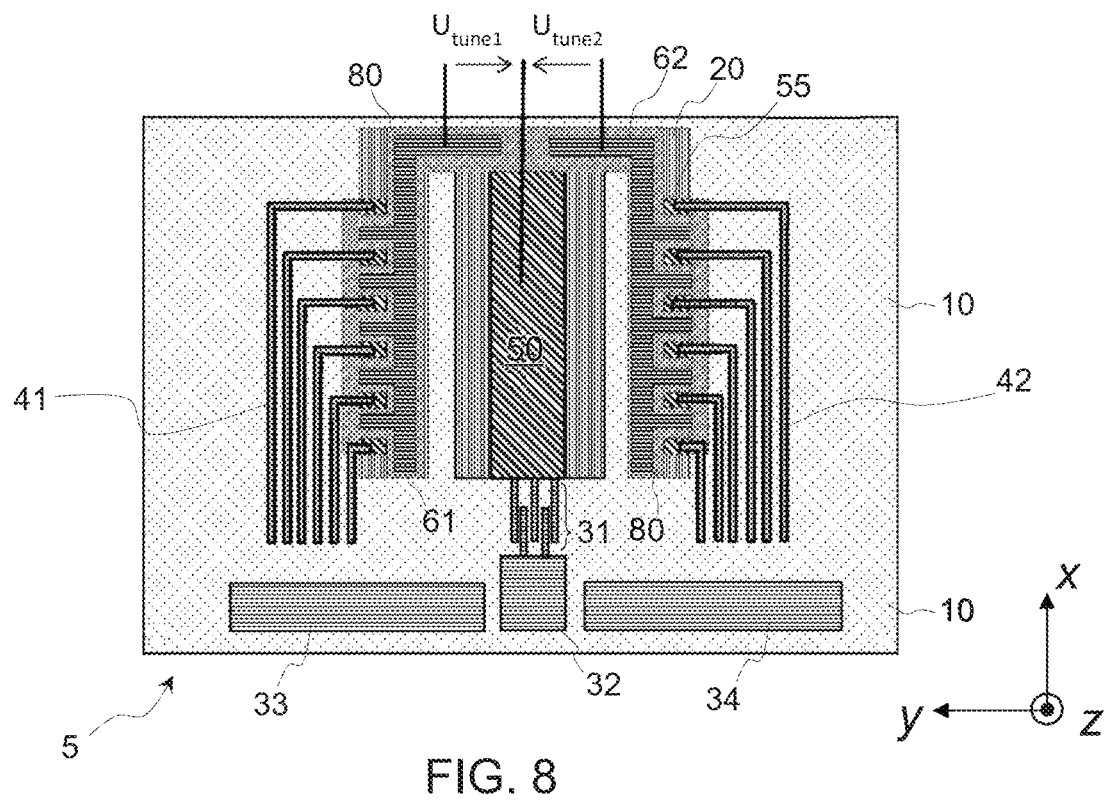

Attention is now drawn to FIGS. 7 and 8, whose designs make it possible to split the resonator 4, 5 into two independent resonators, whose channel impedances can nevertheless still be independently tuned. Such designs make it notably possible to obtain asymmetric standing modes in the cavity. In detail, the SAW resonators 4, 5 involve, each, a first gate element 61 and a second gate element 62, which is similarly configured. Note, the gate element 62 is electrically insulated from both the layer 20 and the first gate element 61. This way, two gateable channels can be defined for the two sets of fingers 41, 42, respectively. Each channel extends from fingers of a respective set to the ground. The first and second gate elements 61, 62 are, each, configured to independently allow the electrical impedance of a respective channel to be continuously tuned, by applying a voltage bias to the corresponding gate element with respect to the ground, in operation of the device 4, 5.

The IDT may for instance be made of a material that is sufficiently reflecting, to act both as an acoustic source and an acoustic reflector, so as to decouple behaviors of the two sets 41, 42 of fingers, in operation. This way, one may split the resonator into two independent resonators, which can nevertheless be read out with the same IDT and can be electrically tuned independently. To that aim, a high-density metal like gold may be used for the IDT. In this way, the high reflection of the IDT results in fully decoupling the LHS from the RHS of the resonator; the IDT is acting simultaneously as an acoustic source and a reflector.

Another aspect of the invention is now described in reference to FIG. 9, which concerns a method of operating a SAW resonator 1-5, such as described above.

That is, a SAW resonator is provided (step S10, FIG. 9), which comprises a substrate 10 supporting a gateable, electrically conducting layer 20; an IDT 31-32; a grating 41-42 with a plurality of separated fingers 41, 42; an ohmic contact 50; and a gate element 60. Layer 20 and the IDT 31-32 are both connectable S20 to a ground (layer 20 connects to the ground via the ohmic contact 50). Each finger 41, 42 is electrically connected to a lateral side of layer 20, so as to define a gateable channel, as described earlier in reference to FIGS. 2-8.

The device 1-5 is operated by tuning (step S30-S60) the electrical impedance of the gateable channel, which is achieved by applying a voltage bias $U_{tune}$ to the gate element 60 with respect to the ground.

Tuning the electrical impedance of the gateable channel may typically be done so as to tune S40 the reflection coefficient of the reflector grating 41-42, and tuning this coefficient may advantageously be carried out so as to tune S50 the frequency of the SAW resonator.

In more detail, the reflection coefficient r of a single reflector electrode can be expressed as $$r = j\left(P_z(\eta)\frac{K^2}{2} + F_z\frac{a}{\lambda}\right),$$

where j is an imaginary unit, $P_z(\eta)$ is a piezoelectric coefficient, which depends on a metallization ratio $\eta$, $K^2$ denotes the electromechanical coupling coefficient, $F_z$ is the mechanical reflection coefficient, $\alpha$ is the metallization thickness of reflector grating and $\lambda$ is a wavelength at which the SAW resonator is operating. The above equation is normally valid for $\alpha/\lambda<2\%$, else higher-order mechanical reflection coefficients need be considered. It is known that the piezoelectric coefficient $P_z(\eta)$ is positive/negative for an opened/shortened reflector grating. If the mechanical reflection coefficient $F_z$ is comparable to the magnitude of $P_z(\eta)$, a significant change in the reflection coefficient r can be induced by switching from opened to shortened mirror reflectors and vice versa. The magnitude of the mechanical reflection coefficient $F_z$ can be set during and according to the device fabrication. This can be achieved by the reflector material itself, like a multi-layer reflector in a grooved array and by the metallization thickness $\alpha$. Tunability control over the reflection coefficient r makes it possible to tune the effective cavity length $L_c$, which is the sum of the physical cavity length d and the penetration depth $2L_p$. The resonator mode $f_n$ is expressed as $$f_n = \frac{nv}{2L_c} = \frac{nv}{2\left(d + \frac{\lambda}{2|r|}\right)} = \frac{nf_0|r|}{1 + \left(\frac{2d|r|}{\lambda_0}\right)}$$

and can be tuned by controlling the reflection coefficient r. In the above equation v is the phase velocity of the surface acoustic wave, $\lambda_0/f_0$ is a wavelength/frequency at which the resonator is operated. Provided that $$\frac{2d}{\lambda_0} \cdot |r| = \frac{d}{2L_p} \ll 1$$

(as is the case when twice the penetration depth, $2L_p$, is larger than the physical cavity length d) the resonator mode $f_n$ and the free spectral range $(\Delta f = f_{n+1} - f_n)$ can be tuned linearly as a function of $|r|$, i.e., $f_n = nf_0|r|$, $\Delta f = f_0|r|$.

Thus, it is possible to exploit the bias tunability of the piezoelectric reflector grating coefficient $P_z(\eta)$ to tune the reflection coefficient r.

In embodiments, and prior to tuning said electrical impedance, the device 1-5 is fabricated, e.g., according to a process S100-S180 (FIG. 10), which concerns another aspect of the invention. Upon completing the fabrication, one may want to check S15 an initial value of the electrical impedance. And this impedance may be subsequently tuned S30-S60 so as for it to accurately match a desired value, e.g., a prescribed value desired for the device in operation. Tuning S30-S60 the impedance normally results in a new impedance value that departs from the initial value, as checked at step S15.

The impedance of the channel is typically tuned after fabrication of the device 1-5 and integration thereof in another device or apparatus, e.g., prior to or after supplying the apparatus. I.e., the device 1-5 is typically integrated S10 into a more sophisticated device or apparatus, prior to checking S15 said actual value. Yet, the impedance may be corrected, after integration of the SAW resonator 1-5, thanks to the present approach.

For example, a SAW resonator 1-3, such as depicted in FIGS. 3, 5 and 6 may be integrated in a quantum computation device. In that case, the SAW device may typically link two computational circuits (i.e., qubits) of the quantum computation device. In variants, the SAW resonator 1-5 may for example be implemented in an apparatus involving an electron confinement layer, for example at an interface between two contiguous layers of semiconductor materials for confining an electron gas in an essentially two-dimensional area, e.g., as in a spin logic device. Other applications can be contemplated, e.g., to quantum dots, spin-qubits, trapped-ions and photonic cavities, for example.

If the device 4, 5 includes two gateable channels, as in FIGS. 7 and 8, then the impedance of each channel may be independently tuned, after fabrication of the device 1-5 and, e.g., integration of the device in another device or apparatus.

Referring now to FIG. 10, another aspect of the invention is described, which concerns a method of fabrication of a SAW resonator 1-5.

A substrate 10 is provided S100. A FET-like structure is then processed S110-S140, so as for the structure to comprise a gateable, electrically conducting layer 20, a main ohmic contact 50 and side ohmic contacts 55. This is done so as for layer 20 to be connectable to a ground via the main ohmic contact 50. Then, a gate element 60 is patterned S150-S160 on the fabricated structure, so as for the gate element to be electrically insulated from the conducting layer 20. A reflector grating is patterned S160, at least partly on the substrate 10 provided. Step S160 is carried out so as for the reflector grating to comprise a plurality of electrically separated fingers 41, 42, where each finger 41, 42 connect to a lateral side of layer 20, via a respective side ohmic contacts 55. This, as explained earlier, define a gateable channel extending from said fingers to the ground via the side ohmic contacts 55, the conducting layer 20 and the main ohmic contact. Consistently with the desired properties of the device 1-5, the gate element 60 is patterned S160 so as to allow an electrical impedance of the gateable channel to be continuously tuned (by applying a voltage bias to this gate element with respect to the ground), in operation of the SAW resonator.

In embodiments, a piezoelectric substrate is first provided S100, which already hosts a conducting layer 20. Then, the structure is patterned S130 so as to form a mesa, on which the transistor will be fabricated. Prior to step S130, a basis (barrier) layer 15 may be deposited on layer 20. In the next step S140 ohmic contacts are fabricated on top of the mesa. An oxide 80 may possibly be deposed in the next processing step S150, to complement layer 15 and form the barrier. This step, however, is not mandatory, as explained earlier. The oxide 80 may be necessary if the piezoelectric substrate contains a conducting bulk layer. In case of a two-dimensional gas, however, this is not required, though the oxide layer may still be useful to minimize leakage currents. After the oxide deposition S150, the gate is defined S160 on top of the mesa. Then, the reflector grating is deposited S170 and, finally, the ground plane (which may be any electrical conductor), the feed line (e.g., aluminum) and the IDT are patterned S180.

This makes it notably possible to achieve a resonator 1 such as depicted in FIG. 3, which includes a piezoelectric substrate 10 hosting a conducting layer 20, where all reflector fingers 41, 42 are electrically separated from each other and connected via a common gate 60 to the ground, as discussed earlier in reference to FIGS. 3, 5-8. By controlling the gate bias $U_{tune}$, all fingers of the resonator can be connected to the ground via ohmic contacts 50, 55, which results in a shortened reflector grating, or can be electrically disconnected from the ground (open reflector grating).

Note, the above situation (shortened and open reflectors) are special cases of a more general case, where a transistor channel impedance can be controlled continuously by a gate bias $U_{tune}$ from 0Ω (shortened reflectors) to infinity (open reflectors).

In variants, a device 2 such as depicted in FIG. 5 may be achieved, where each reflector electrode is connected via a common gate 60 to the neighbor reflector electrode. By controlling the bias $U_{tune}$ the transistor channel impedance can be controlled continuously from 0Ω (shortened reflectors) to infinity (open reflectors). Yet, the structure depicted in FIG. 3 is arguably simpler and should normally allow smaller footprints to be achieved, in comparison to the device shown in FIG. 5.

Other structural designs are possible, as exemplified in FIG. 6. In addition, the designs of FIGS. 3, 5 and 6 can be further modified to make it possible to couple odd to even acoustic modes of the resonator to the IDT, as explained earlier. This may notably be achieved by splitting the common gate into two separate gates 61, 62, which, in turn, allows the reflection coefficient of the left and right reflector to be independently controlled (FIGS. 7, 8). In such cases, the standing acoustic waves can be spatially shifted according to the interdigitated transducer position. If the spatial standing acoustic modes profile within the cavity is symmetric with respect to the IDT position then only even or odd acoustic modes can couple to the IDT, this depending on the sign of the reflection coefficient of the reflector fingers. If the symmetry of the system is broken, as is the case when $U_{tune1} \neq U_{tune2}$, then the spatial standing acoustic modes profile is shifted according to the IDP position. This results in a spectrum modification and, in some favorable cases, makes it possible to simultaneously couple acoustic odd and even modes to the IDT and hence make it possible to read out all cavity modes within the IDT bandwidth.

Where a highly reflecting interdigitated transducer is achieved, which fully separates the cavity into two independent cavities (left and right cavities in FIGS. 7, 8), two independent spectra can be read and modified simultaneously by controlling $U_{tune1}$ and $U_{tune2}$.

The methods as described above can be used in the fabrication of integrated circuit chips or other electronic devices, such as a quantum computer or a spin-logic device. Some of the methods described herein can be used in the fabrication of integrated circuit chips. The resulting apparatus can be distributed by the fabricator in raw form, e.g., in raw wafer form (that is, as a single wafer that has multiple unpackaged chips), as a bare die, or in a packaged form. In the latter case, the SAW resonator may for example be integrated on a chip, which is mounted in a single chip package (such as a plastic carrier, with leads that are affixed to a motherboard or other higher-level carrier) or in a multichip package (such as a ceramic carrier that has either or both surface interconnections or buried interconnections). In any case the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly cited may be contemplated.

What is claimed is:

1. A method of operating a surface acoustic wave (SAW) resonator device, wherein the method comprises:
   providing a SAW resonator device, which comprises a substrate supporting: a gateable, electrically conducting layer; an interdigital transducer, or IDT; a reflector grating that comprises a plurality of electrically separated fingers; a main ohmic contact; and a gate element, wherein each of the electrically conducting layer and the IDT is connectable to a ground, the conducting layer being connectable to said ground via the main ohmic contact, while each of said fingers is electrically connected to a lateral side of the conducting layer, so as to define a gateable channel extending from said fingers to the ground via the conducting layer and the main ohmic contact; and tuning an electrical impedance of the gateable channel by applying a voltage bias to the gate element with respect to said ground.

2. The method according to claim 1, wherein the electrical impedance of the gateable channel is tuned so as to tune a reflection coefficient of the reflector grating.

3. The method according to claim 1, wherein said reflection coefficient is tuned so as to tune a frequency of the SAW resonator.

4. The method according to claim 1, wherein the method further comprises, prior to tuning said electrical impedance:
   fabricating the device; and
   checking an initial value of said electrical impedance, whereby said impedance is tuned so as for it to reach a desired value that departs from said initial value.

5. The method according to claim 1, wherein the method further comprises, prior to checking said actual value, integrating the fabricated SAW device in an apparatus.

6. The method according to claim 1, wherein said apparatus is a quantum computation device, where the SAW device links two computational circuits of the quantum computation device.

7. A method of fabrication of a surface acoustic wave (SAW) resonator device, wherein the method comprises:
   providing a substrate;
   processing, on the substrate provided, a structure comprising a gateable, electrically conducting layer, a main ohmic contact and side ohmic contacts, so as for the electrically conducting layer to be connectable to a ground via the main ohmic contact;
   patterning a gate element on the fabricated structure, so as for the gate element to be electrically insulated from the conducting layer; and
   patterning, at least partly on the substrate provided, a reflector grating comprising a plurality of electrically separated fingers, so as for each of the fingers to connect to a lateral side of the conducting layer via a respective one of the side ohmic contacts and thereby define a gateable channel extending from said fingers to the ground via the side ohmic contacts, the conducting layer and the main ohmic contact,
   wherein
   the gate element is patterned so as to allow an electrical impedance of the gateable channel to be continuously tuned by applying a voltage bias to this gate element with respect to said ground, in operation of the device.

* * * * *